United States Patent
Cho

(10) Patent No.: US 11,233,514 B2
(45) Date of Patent: Jan. 25, 2022

(54) SEMICONDUCTOR DEVICE INCLUDING SUBSYSTEM INTERFACES AND COMMUNICATIONS METHOD THEREOF

(71) Applicant: SAMSUNG ELECTRONICS CO., LTD., Suwon-si (KR)

(72) Inventor: Dong Sik Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/881,318

(22) Filed: May 22, 2020

(65) Prior Publication Data
US 2021/0119631 A1    Apr. 22, 2021

(30) Foreign Application Priority Data
Oct. 16, 2019  (KR) .......................... 10-2019-0128193

(51) Int. Cl.
*H03K 19/0185* (2006.01)
*H03K 19/08* (2006.01)
*H01L 29/66* (2006.01)

(52) U.S. Cl.
CPC ....... *H03K 19/08* (2013.01); *H01L 29/66431* (2013.01); *H03K 19/01855* (2013.01)

(58) Field of Classification Search
CPC ....... H03K 19/0175; H03K 19/017509; H03K 19/01855; H03K 19/08; H01L 29/66431
See application file for complete search history.

(56) References Cited

U.S. PATENT DOCUMENTS

| | | | |
|---|---|---|---|
| 5,524,112 A * | 6/1996 | Azuma | H04J 3/062 370/402 |
| 5,966,409 A * | 10/1999 | Maeda | H04L 7/0008 370/513 |
| 6,901,503 B2 | 5/2005 | Barlow et al. | |
| 6,925,512 B2 | 8/2005 | Louzoun et al. | |
| 7,711,875 B2 | 5/2010 | Gloekler et al. | |

(Continued)

*Primary Examiner* — Seokjin Kim
(74) *Attorney, Agent, or Firm* — F. Chau & Associates, LLC

(57) ABSTRACT

A subsystem interface, a semiconductor device including the subsystem interface, and a communications method of the semiconductor device are provided, the subsystem interface comprising a transmitter including a first transmission port configured to transmit a first clock signal, a second transmission port configured to transmit a first data signal, a first reception port configured to receive a first flow control signal, and a third transmission port configured to transmit a first synchronization signal, a receiver including a second reception port configured to receive a second clock signal, a third reception port configured to receive a second data signal, a fourth transmission port configured to transmit a second flow control signal, a fourth reception port configured to receive a second synchronization signal, and a control module configured to control operations of the transmitter and the receiver, including performing a transmitter hand-shake by sending a request signal from the second transmission port and receiving an acknowledgement signal to the first reception port, or performing a receiver hand-shake by receiving the request signal to the third reception port and sending the acknowledgement signal from the fourth transmission port.

19 Claims, 10 Drawing Sheets

(56) References Cited

U.S. PATENT DOCUMENTS

| | | |
|---|---|---|
| 8,705,579 B2 | 4/2014 | Anderson et al. |
| 9,882,711 B1 | 1/2018 | Jang et al. |
| 2006/0047754 A1 | 3/2006 | Wenkata Subramanian et al. |
| 2008/0218225 A1* | 9/2008 | Shibayama ............... G06F 1/12 327/144 |
| 2009/0323876 A1* | 12/2009 | Ono ........................ H04L 7/02 375/354 |
| 2011/0235459 A1* | 9/2011 | Ware ..................... G06F 3/0629 365/233.11 |
| 2012/0155489 A1* | 6/2012 | Mangano ............ G06F 13/4059 370/466 |
| 2014/0047158 A1* | 2/2014 | Frans ................... G06F 3/0613 711/102 |
| 2014/0064096 A1* | 3/2014 | Stevens ................ G06F 13/385 370/236 |
| 2015/0207581 A1* | 7/2015 | Mangano ................. H04L 7/10 370/516 |
| 2015/0362980 A1 | 12/2015 | Tripathi |
| 2016/0350259 A1* | 12/2016 | Jeon ...................... G06F 13/364 |
| 2016/0371200 A1* | 12/2016 | Catherwood ............ G06F 13/42 |
| 2016/0374029 A1* | 12/2016 | Flynn .................. H04W 52/221 |
| 2017/0214480 A1* | 7/2017 | Kim ...................... G06F 1/3234 |
| 2017/0214514 A1* | 7/2017 | Manohar ............... H04L 7/0037 |
| 2017/0220495 A1* | 8/2017 | Jeon ................... G06F 13/4068 |
| 2017/0222684 A1* | 8/2017 | Khan ....................... H04B 1/40 |
| 2018/0188768 A1* | 7/2018 | Skjoldborg ......... G06F 13/4273 |
| 2018/0203498 A1* | 7/2018 | Song .................... G06F 1/3296 |
| 2018/0246830 A1 | 8/2018 | Zhu et al. |
| 2019/0171607 A1* | 6/2019 | Chen ................... G06F 13/4221 |
| 2020/0233829 A1* | 7/2020 | Valiparambil Divakar ................. G06F 1/26 |

* cited by examiner

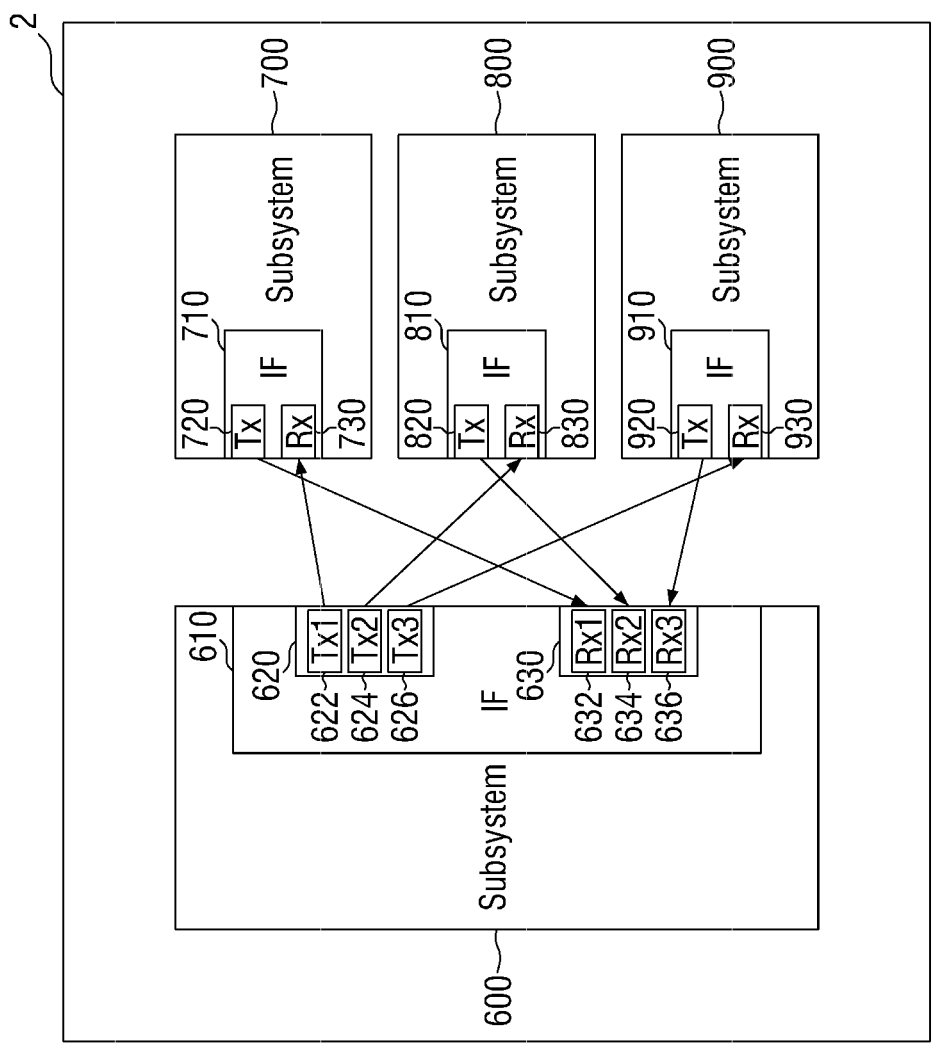

SEMICONDUCTOR DEVICE INCLUDING SUBSYSTEM INTERFACES AND COMMUNICATIONS METHOD THEREOF

CROSS-REFERENCE TO RELATED APPLICATION

This application claims priority under 35 U.S.C. § 119 to Korean Patent Application No. 10-2019-0128193 filed on Oct. 16, 2019 in the Korean Intellectual Property Office, and all the benefits accruing therefrom, the entire contents of which are herein incorporated by reference.

TECHNICAL FIELD

The present disclosure relates to subsystem communications within a semiconductor device, and more particularly relates to a semiconductor device including subsystem interfaces and a communications method thereof.

DESCRIPTION OF RELATED ART

When message exchange is required between independent subsystems of a semiconductor device, a mailbox system may be used. The mailbox system may employ a method in which one subsystem of the message exchange accesses a mailbox to generate an out-of-band interrupt to another subsystem.

Each subsystem has a bus connection to the mailbox, and the mailbox is located in a region of the semiconductor device to which a power supply voltage is continuously supplied for a message to be received at any time. Accordingly, providing communications between subsystems via the mailbox may affect power consumption and bus congestion.

SUMMARY

Exemplary embodiments of the present disclosure may provide a subsystem interface capable of alleviating bus congestion and reducing power consumption, a semiconductor device including the subsystem interface, and/or a communications method of the subsystems in a semiconductor device.

According to an exemplary embodiment of the present inventive concept, a subsystem interface comprises a transmitter including a first transmission port configured to transmit a first clock signal, a second transmission port configured to transmit a first data signal, a first reception port configured to receive a first flow control signal, and a third transmission port configured to transmit a first synchronization signal, a receiver including a second reception port configured to receive a second clock signal, a third reception port configured to receive a second data signal, a fourth transmission port configured to transmit a second flow control signal, a fourth reception port configured to receive a second synchronization signal, and a control module configured to control operations of the transmitter and the receiver, including performing a transmitter hand-shake by sending a request signal from the second transmission port and receiving an acknowledgement signal to the first reception port, or performing a receiver hand-shake by receiving the request signal to the third reception port and sending the acknowledgement signal from the fourth transmission port.

According to an exemplary embodiment of the present inventive concept, a semiconductor device comprises a first subsystem including a first subsystem interface having first to fourth ports, the first subsystem interface being configured to establish a first side of a connection using the first to third ports and transmit data using the first to fourth ports, and a first control module configured to perform a transmitter hand-shake by sending a request signal from the second port and receiving an acknowledgement signal to the third port, and at least one second subsystem including a second subsystem interface having fifth to eighth ports, the second subsystem interface being configured to establish a second side of the connection with the first subsystem interface by communicating with the first to third ports of the first subsystem interface using the fifth to seventh ports, and to receive data from the first subsystem interface by communicating with the first to fourth ports of the first subsystem interface using the fifth to eighth ports, and a second control module configured to perform a receiver hand-shake by receiving the request signal to the sixth port and sending the acknowledgement signal from the seventh port.

According to an exemplary embodiment of the present inventive concept, a communications method includes: providing a first subsystem interface including at least first to fourth ports and a second subsystem interface including at least fifth to eighth ports; performing at least one of a transmitter hand-shake by sending a first signal from the second port and receiving a second signal to the third port, or a receiver hand-shake by receiving the first signal to the sixth port and sending the second signal from the seventh port; and transmitting data from the first subsystem to the second subsystem by providing a third signal from the first port to the fifth port, providing a fourth signal from the second port to the sixth port, providing a fifth signal from the seventh port to the third port, and providing an eighth signal from the fourth port to the eighth port, wherein the signal provided from the first port to the fifth port is a clock signal.

According to an exemplary embodiment of the present inventive concept, a communications method of a semiconductor device comprises providing a first subsystem interface including first to fourth ports and a second subsystem interface including fifth to eighth ports, providing a clock signal from the first port to the fifth port, providing a connection request signal from the second port to the sixth port, in response to the connection request signal, generating a first in-band interrupt to a second subsystem including the second subsystem interface, providing, by the first in-band interrupt, a connection response signal from the seventh port to the third port to establish a connection between the first subsystem interface and the second subsystem interface.

According to an exemplary embodiment of the present inventive concept, a communications method of a semiconductor device comprises providing a first subsystem interface including first to fourth ports and a second subsystem interface including fifth to eighth ports, providing a clock signal from the first port to the fifth port, monitoring a flow control signal provided from the seventh port to the third port to provide a first synchronization signal having a first signal width from the fourth port to the eighth port, and providing a data signal from the second port to the sixth port to provide the data signal from the first subsystem interface to the second subsystem interface.

According to an exemplary embodiment of the present inventive concept, a communications method of a semiconductor device comprises providing a first subsystem interface including first to fourth ports and a second subsystem interface including fifth to eighth ports, providing a clock signal from the first port to the fifth port, providing a synchronization signal from the fourth port to the eighth port, and generating a first in-band interrupt to a second subsystem including the second subsystem interface, monitoring the synchronization signal from the fourth port to the eighth port to generate a second in-band interrupt to the second subsystem including the second subsystem interface, and changing, by the second in-band interrupt, a signal level of a flow control signal provided from the seventh port to the third port to terminate a connection between the first subsystem interface and the second subsystem interface.

It shall be understood that aspects of the present disclosure are not limited to the exemplary embodiments set forth herein. The above and other aspects of the present disclosure will become more apparent to those of ordinary skill in the pertinent art to which the present disclosure pertains by referencing the description of the present disclosure as continued below.

BRIEF DESCRIPTION OF THE DRAWINGS

The above and other aspects and features of the present disclosure will become more apparent by describing in detail exemplary embodiments thereof with reference to the attached drawings, in which:

FIG. 10 is a block diagram of a semiconductor device according to an exemplary embodiment of the present disclosure.

DETAILED DESCRIPTION

Hereinafter, exemplary embodiments of the present inventive concept will be described with reference to the accompanying drawings.

Figure 1:
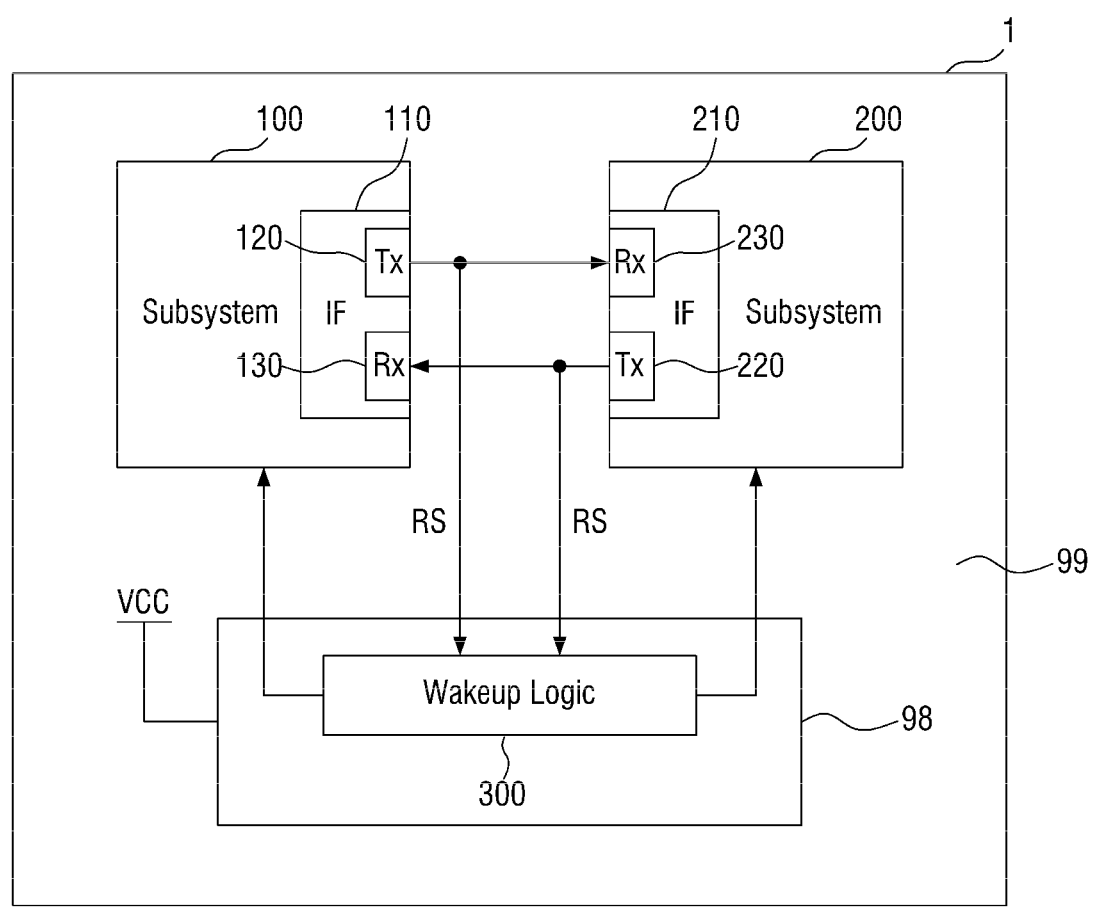
FIG. 1 is a block diagram of a semiconductor device according to an exemplary embodiment of the present disclosure.

FIG. 1 illustrates a semiconductor device according to an exemplary embodiment.

Referring to FIG. 1, a semiconductor device 1 may include a power supply voltage region 98 to which a power supply voltage VCC is continuously provided and an operation region 99, which excludes the power supply voltage region 98, to which the power supply voltage VCC is not continuously provided.

Here, the fact that the power supply voltage VCC is not continuously provided to the operation region 99 may mean that the power supply voltage VCC is intermittently provided under control of, e.g., a power management unit PMU instead of continuously providing the power supply voltage VCC to either or both subsystems 100 and 200 disposed in the operation region 99.

Wake-up logic 300 may be disposed in the power supply voltage region 98, and the subsystems 100 and 200 may be disposed in the operation region 99. Although FIG. 1 illustrates only two subsystems 100 and 200 in order to facilitate a description of the technical spirit of the present disclosure, the embodiments are not limited thereto as there may be two or more subsystems in the semiconductor device. That is, the semiconductor device 1 may include any plurality of independent subsystems.

In an exemplary embodiment, the subsystems 100 and 200 may be clock managers and may be share resource controllers or debug controllers. Further, the subsystems 100 and 200 may include a cellular subsystem, an application processor subsystem, a navigation subsystem, a sensor subsystem, a voice trigger subsystem, an audio subsystem, a Wi-Fi subsystem, a Bluetooth® subsystem or the like, but the embodiments are not limited thereto.

The subsystem 100 may include a subsystem interface 110, and the subsystem 200 may include a subsystem interface 210. The subsystem 100 and the subsystem 200 may communicate with each other through the subsystem interfaces 110 and 120. In other words, the subsystem 100 and the subsystem 200 may exchange messages or data with each other using the subsystem interfaces 110 and 120.

As used herein, the term "subsystem interface" is used to facilitate understanding, but the subsystem interfaces 110 and 120 may be implemented in hardware, firmware and/or software under the technical scope and sprit of the present disclosure. If necessary, each or any of the subsystem interfaces may be implemented as a subsystem interface "device", "circuit", "unit" or "module." In an exemplary embodiment, the subsystem interfaces 110 and 120 according to the present inventive concept may each be implemented in program steps tangibly embodied in a program storage device.

The subsystem interface 110 may include a transmitter 120 and a receiver 130, and the subsystem interface 210 may include a receiver 230 and a transmitter 220. The transmitter 120 may be connected to the receiver 220 through a channel or a wire, and the transmitter 220 may be connected to the receiver 130 through a channel or a wire.

That is, the subsystem 100 may transmit a message or data to the receiver 230 through the transmitter 120, and the subsystem 200 may transmit a message or data to the receiver 130 through the transmitter 220.

The wake-up logic 300 may be disposed in the power supply voltage region 98 to supply power to the subsystems 100 and/or 200. For example, the wake-up logic 300 receives a connection request signal RS from the subsystem 100, and in response thereto, provides power to the subsystem 200 when the subsystem 200 is not in an enabled state, so that the subsystem 200 can be enabled. Further, the wake-up logic 300 receives a connection request signal RS from the subsystem 200, and in response thereto, provides power to the subsystem 100 when the subsystem 100 is not in an enabled state, so that the subsystem 100 can be enabled.

Hereinafter, an exemplary configuration of the subsystem interface 110 will be described with reference to FIG. 2. The following description is equally applicable to the subsystem interface 210, but duplicate description may be omitted.

Figure 2:
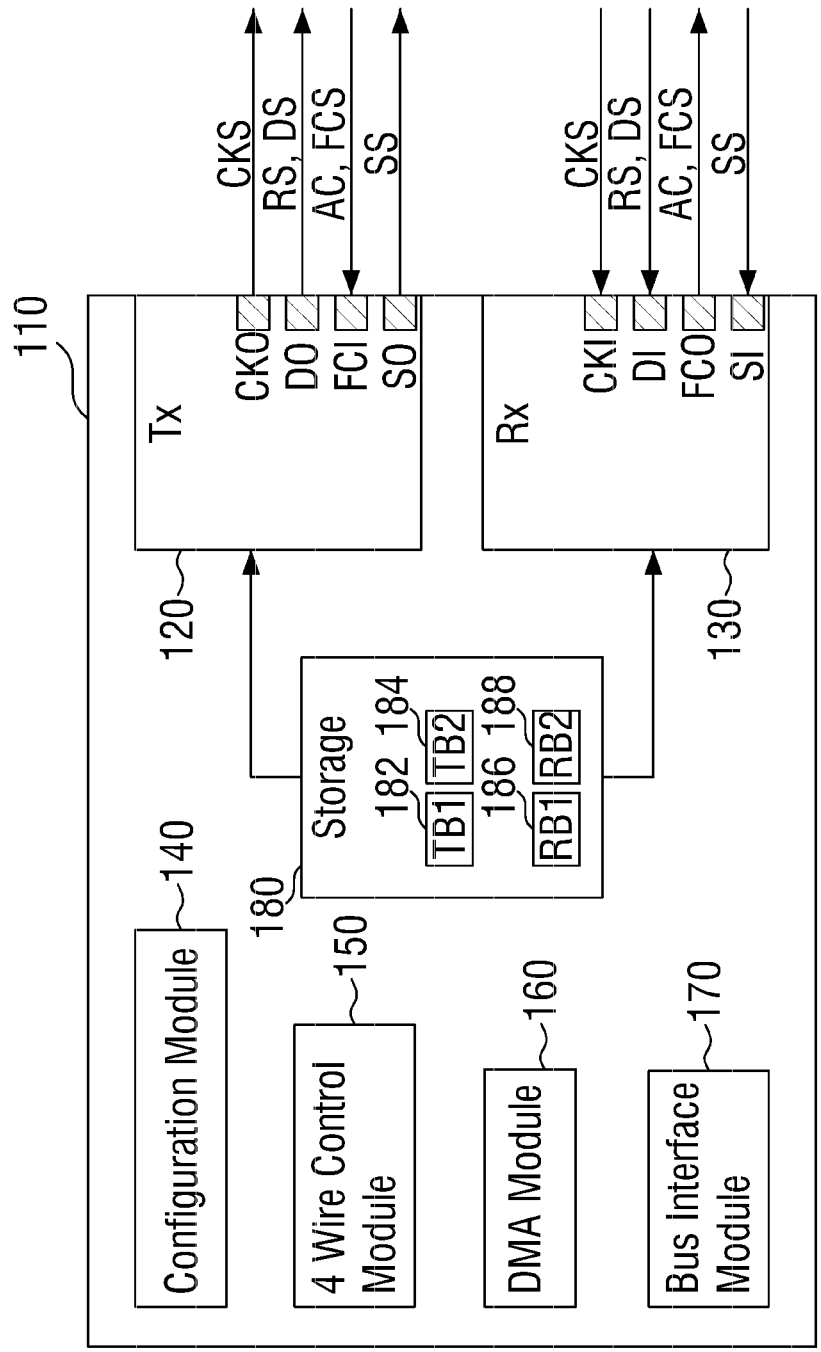
FIG. 2 is a block diagram of a subsystem interface of FIG. 1.

FIG. 2 illustrates the subsystem interface of FIG. 1.

Referring to FIG. 2, the subsystem interface 110 includes a transmitter 120, a receiver 130, a configuration module 140, a 4-wire control module 150, a DMA module 160, a bus interface module 170 and a storage unit 180.

Although FIG. 2 illustrates an embodiment in which the subsystem interface 110 includes the storage unit 180 for simplicity of description, the embodiments are not limited to the illustrated example. If necessary, the storage unit 180 may be disposed in the subsystem 100 outside the subsystem interface 110. In addition, the storage unit 180 may be disposed outside the subsystem 100.

Referring together to FIGS. 1 and 2, the transmitter 120 may include four ports CKO, DO, FCI and SO, and the receiver 130 may also include four ports CM, DI, FCO and SI. The four ports CKO, DO, FCI and SO of the transmitter 120 may be connected to a receiver of an independent subsystem. For example, the four ports CKO, DO, FCI and SO of the transmitter 120 of the subsystem 100 may be respectively connected to the four ports CKI, DI, FCO and SI of the receiver 230 of the subsystem 200. Further, the four ports CKO, DO, FCI and SO of the transmitter 220 of the subsystem 200 may be respectively connected to the four ports CKI, DI, FCO and SI of the receiver 130 of the subsystem 100.

A clock signal CKS may be provided to the other subsystem through the port CKO, and the clock signal CKS may be provided from the other subsystem through the port CKI. When the subsystem 100 and the subsystem 200 exchange data with each other, the clock signal CKS may be used for timing control, such as, for example, to exchange signals between the subsystem 100 and the subsystem 200. In other words, the subsystem 100 may transmit a message or data to the subsystem 200 in accordance with the cycle of the clock signal CKS. In a case where the subsystem 100 establishes a connection to transmit a message or data to the subsystem 200, the clock signal CKS may be provided from the subsystem 100 to the subsystem 200 while the connection is maintained.

The connection request signal RS and a data signal DS may be provided from the subsystem 100 through the port DO, and the connection request signal RS and the data signal DS may be provided from the other subsystem through the port DI. When the subsystem 100 and the subsystem 200 exchange data with each other, the connection request signal RS may be used, for example, by the wake-up logic 300 to enable the subsystem interface of the subsystem 100 or the subsystem 200, and the data signal DS may be used, for example, to transmit a necessary message or data from the subsystem 100 to the subsystem 200. As shown in FIG. 2, each request signal RS is provided by one subsystem's interface transmitter to the wake-up logic 300. In this embodiment, each request signal RS is also provided by one subsystem's interface transmitter to the other subsystem's interface receiver, but embodiments are not limited thereto. For example, the other subsystem need not receive RS if the wake-up logic provides a signal responsive to RS to the other subsystem even if the other subsystem is already enabled.

A connection response signal AC and a flow control signal FCS may be provided from the other subsystem through the port FCI, and the connection response signal AC and the flow control signal FCS may be provided to the other subsystem through the port FCO.

That is, in the transmitter 120, the port FCI may be used to receive a signal unlike the other ports CKO, DO and SO, and in the receiver 130, the port FCO may be used to transmit a signal unlike the other ports CM, DI and SI.

When the subsystem 100 and the subsystem 200 exchange data with each other, the connection response signal AC may be used, for example, to establish a connection for communication between the subsystem 100 and the subsystem 200.

The flow control signal FCS may be used, for example, to transmit a data reception state of the subsystem 100 and the subsystem 200. Specifically, when the subsystem 100 transmits data to the subsystem 200, the subsystem 200 may inform the subsystem 100 whether the data reception is possible through the flow control signal FCS. Similarly, when the subsystem 200 transmits data to the subsystem 100, the subsystem 100 may inform the subsystem 200 whether the data reception is possible through the flow control signal FCS.

A synchronization signal SS may be provided to the other subsystem through the port SO, and the synchronization signal SS may be provided from the other subsystem through the port SI. When the subsystem 100 and the subsystem 200 exchange data with each other, the synchronization signal SS may be used to indicate whether the provision of the data signal DS is started, or indicate whether the provision of the data signal DS has been completed.

Specifically, when the subsystem 100 transmits data to the subsystem 200, the subsystem 100 may inform the subsystem 200 that a new data unit is to be transmitted through the synchronization signal SS whenever a specific data unit is transmitted. Similarly, when the subsystem 200 transmits data to the subsystem 100, the subsystem 200 may inform the subsystem 100 that a new data unit is to be transmitted through the synchronization signal SS whenever a specific data unit is transmitted.

The configuration module 140 may be a module for configuring a 4-wire interface. In an exemplary embodiment, the configuration module 140 may configure the 4-wire interface using software.

The 4-wire control module 150 may perform control for an operation of the four ports CKO, DO, FCI and SO included in the transmitter 120 and four ports (CM, DI, FCO, SI) included in the receiver 130.

The DMA module 160 serves to read a message or data to be transmitted through a bus or write a received message or data through a bus, and may be connected to the bus through the bus interface module 170. The DMA module 160 functions as a bus master when reading data through the bus or writing data to the bus, and may also serve as a bus slave that writes data sent by an external system or device (e.g., a CPU) to a buffer in a 4-wire interface.

The storage unit 180 may include transmission buffers 182 and 184 and reception buffers 186 and 188.

Data stored in the transmission buffers 182 and 184 may be provided in the form of the data signal DS through the port DO. The data signal DS received through the port DI may be stored in the reception buffers 186 and 188.

In an exemplary embodiment, when the amount of data stored in the reception buffers 186 and 188 is greater than or equal to a predetermined storage amount, the subsystem interface 110 may notify the other subsystem through the port FCO. Specifically, when the amount of data stored in the reception buffers 186 and 188 is greater than or equal to a predetermined storage amount, the subsystem interface 110 may notify the other subsystem by changing the signal level of the flow control signal FCS provided to the other subsystem through the port FCO.

In an exemplary embodiment, when one of the reception buffers 186 and 188 is full of data, the subsystem interface 110 may send a request such that the data signal DS is no longer transmitted from the other subsystem by changing the signal level of the flow control signal FCS provided to the other subsystem through the port FCO. However, the embodiments are not limited thereto, and the condition that the subsystem interface 110 changes the signal level of the flow control signal FCS provided to the other subsystem through the port FCO may be modified or implemented differently.

Hereinafter, a communications method of a semiconductor device according to an exemplary embodiment will be described with reference to FIGS. 3 to 9.

Figure 3:
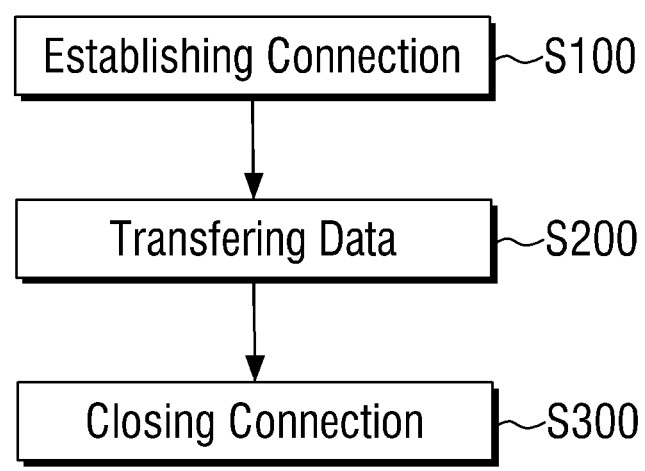
FIG. 3 is a flowchart diagram illustrating a communications method of a semiconductor device according to an exemplary embodiment of the present disclosure.

FIG. 3 illustrates a communications method of a semiconductor device according to an exemplary embodiment. FIGS. 4 to 9 illustrate the communications method of the semiconductor device illustrated in FIG. 3.

In the following description, a communications method of a semiconductor device according to an exemplary embodiment will be described with respect to an example in which the subsystem 100 and the subsystem 200 shown in FIG. 1 establish a connection, and after the subsystem 100 transmits the data signal DS to the subsystem 200, the connection between the subsystem 100 and the subsystem 200 is terminated.

Figure 4:
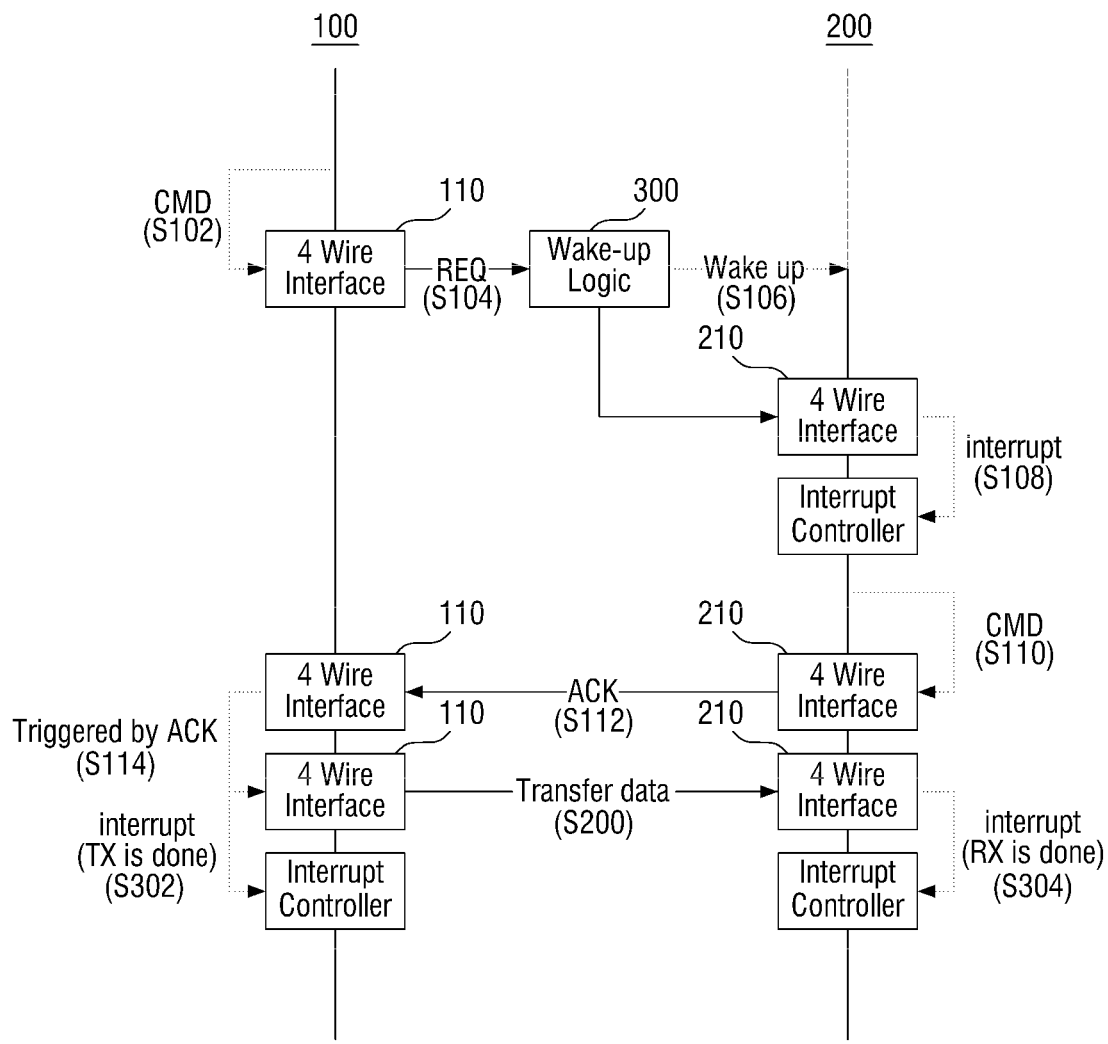
FIG. 4 is a hybrid diagram further illustrating the communications method of FIG. 3.
Figure 5:
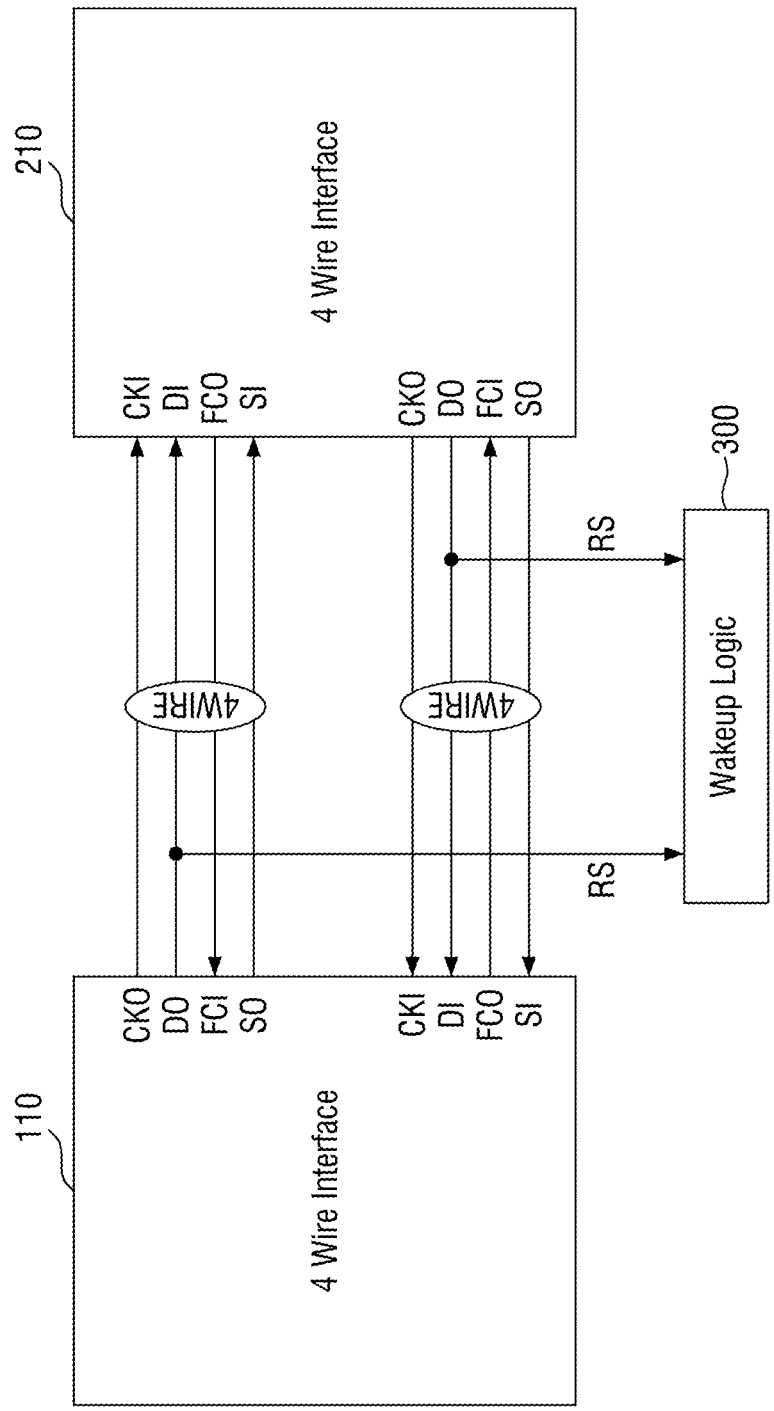
FIG. 5 is a block diagram further illustrating the communications method of FIG. 3.

First, referring to FIG. 3, a connection is established at step S100 by a hand-shake protocol as illustrated in FIG. 4.

Referring to FIGS. 2 and 4 to 6, the subsystem 100 of FIG. 4 may initiate a hand-shake protocol with the subsystem 200 of FIG. 4 and provide the subsystem interface 110 of FIGS. 2, 4, 5 and 6 with a command CMD which requests a connection with the subsystem interface 210 at step S102 of FIG. 4. Accordingly, the configuration module 140 of the subsystem interface 110 may set the transmission parameters of the subsystem interface 110. Although omitted for brevity of description, the subsystem interface 210 may include like components identified by like reference numerals, such as the transmitter 220, the receiver 230, and, if similarly configurable to initiate a hand-shake to send data to another subsystem, a configuration module 240. In an alternate embodiment where the second subsystem 200 need not initiate a hand-shake or send data to another subsystem, the components or functionality of the second subsystem interface 210 may be reduced accordingly or otherwise configured differently than those of the first subsystem interface 110.

The subsystem interface 110 may output the connection request signal RS through the port DO, and the wake-up logic 300 may receive the connection request signal RS at step S104.

For example, the subsystem interface 110 may change the signal level of the connection request signal RS outputted through the port DO from a first level (e.g., a low level L) to a second level (e.g., a high level H), and the wake-up logic 300 may receive it and enable the subsystem interface 210 at step S106.

Meanwhile, the connection request signal RS outputted through the port DO of the subsystem interface 110 may also be provided directly to the subsystem interface 210 through the port DI to initiate a hand-shake.

The wake-up logic 300 receives the connection request signal RS outputted through the port DO of the subsystem interface 110, and determines whether the subsystem 200 of FIG. 1, including the subsystem interface 210, is enabled. If the subsystem 200 including the subsystem interface 210 is enabled, the wake-up logic 300 need not perform a separate operation. However, if the subsystem 200 of FIG. 1 including the subsystem interface 210 is not enabled, the wake-up logic 300 supplies power to the subsystem 200 of FIG. 1 such that the subsystem 200 including the subsystem interface 210 is enabled at step S106.

The subsystem interface 210 may now receive the connection request signal RS through the port DI, and generate an in-band interrupt to the subsystem 200 of FIG. 1 at step S108.

Specifically, when the subsystem interface 210 is enabled and the signal level of the connection request signal RS received through the port DI is changed from the first level L to the second level H, the subsystem interface 210 may generate an in-band interrupt to the subsystem 200 in which the subsystem interface 210 is included.

When an in-band interrupt occurs in the subsystem 200, the configuration module 240 of the subsystem interface 210 may set the reception parameters of the subsystem interface 210. Then, the subsystem 200 may provide the subsystem interface 210 with a command CMD at step S110 which accepts a connection with the subsystem interface 110. Accordingly, the subsystem interface 210 may generate the connection response signal ACK or AC at step S112, completing the hand-shake.

For example, the subsystem interface 210 may change the signal level of the connection response signal AC outputted through the port FCO from the first level L to the second level H.

The subsystem interface 210 may also output the connection response signal AC through the port FCO, and the subsystem interface 110 may receive the connection response signal AC through the port FCI at step S112.

The subsystem interface 110 having received the connection response signal AC through the port FCI may stop outputting the connection request signal RS through the port DO at step S114, after the subsystem interface 210 may have received the request signal RS through the port DI.

For example, the subsystem interface 110 may change the signal level of the connection request signal RS outputted through the port DO from the second level H to the first level L, and the subsystem interface 210 may receive it through the port DI.

Figure 6:
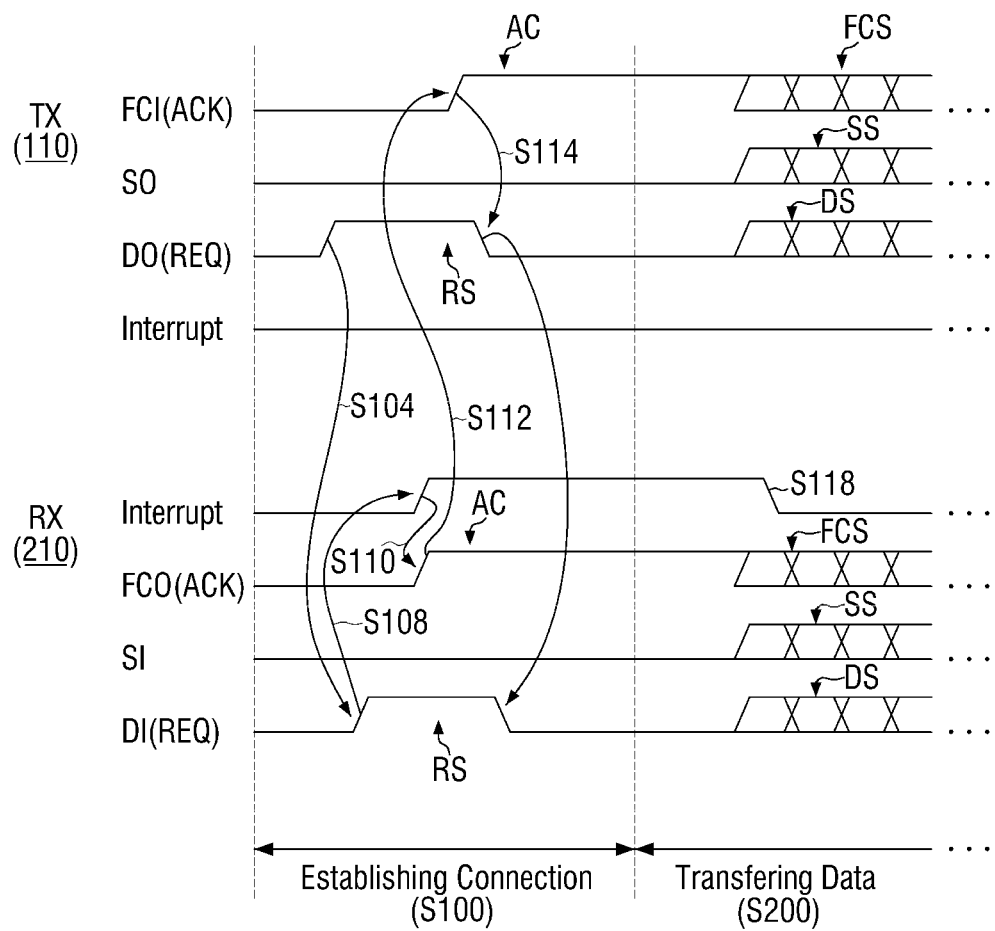
FIG. 6 is a timing diagram further illustrating the communications method of FIG. 3.

Meanwhile, the in-band interrupt generated in the subsystem 200 may be cleared by software at step S118 of FIG. 6.

Through this process, a connection for message or data transmission between the subsystem interface 110 and the subsystem interface 210 may be established.

Then, referring to FIGS. 3 and 4, data is transmitted at step S200 of FIG. 3.

First of all, a configuration of the data signal DS transmitted from the subsystem interface 110 to the subsystem interface 210 will be described with reference to FIGS. 2 and 7.

Figure 7:
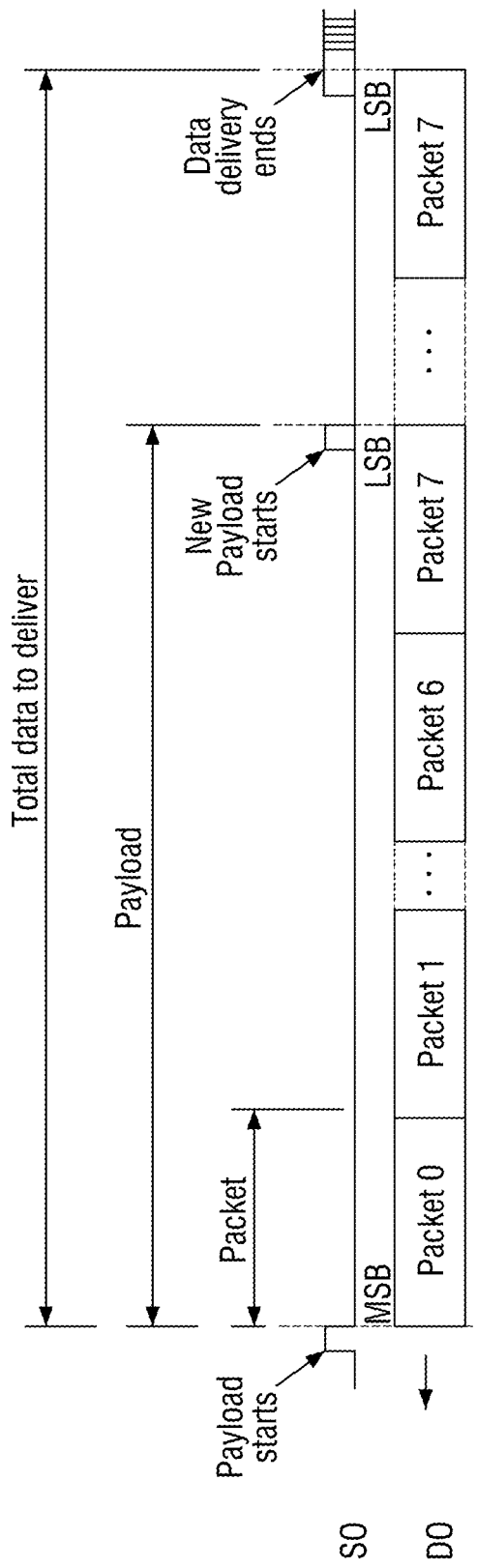
FIG. 7 is a data diagram further illustrating the communications method of FIG. 3.

Referring to FIGS. 2 and 7, the data signal DS transmitted from the subsystem interface 110 to the subsystem interface 210 may include a plurality of payload signals, and each payload signal may include a plurality of packet signals. Although FIG. 7 illustrates an example in which one payload signal includes eight packet signals (packet 0 to packet 7), the embodiments are not limited thereto.

The subsystem interface 110 may provide the synchronization signal SS to the subsystem interface 210 through the port SO in response to each payload signal, and the subsystem interface 210 may receive the synchronization signal SS through the port SI.

That is, the subsystem interface 110 may provide the synchronization signal SS to the subsystem interface 210 through the port SO to inform the subsystem interface 210 that the next payload signal is to be transmitted. The subsystem interface 210 may receive the synchronization signal SS through the port SI to know that the next payload signal is to be received.

In an exemplary embodiment, the subsystem interface 110 may provide the synchronization signal SS to the subsystem interface 210 through the port SO while the last packet signal (e.g., packet 7) of each payload signal is provided to the subsystem interface 210 through the port DO. In other words, the subsystem interface 110 may provide the synchronization signal SS to the subsystem interface 210 through the port SO before providing a new payload signal to the subsystem interface 210 through the port DO.

When all the data to be transmitted to the subsystem interface 210 is transmitted, the subsystem interface 110 transmits the synchronization signal SS to the subsystem interface 210 through the port SO in response to the last payload signal (e.g., the last packet signal of the last payload signal).

The signal width of the synchronization signal SS provided in this case may be different from the signal width of the synchronization signal SS indicating that a new payload signal is to be provided. Specifically, when the subsystem interface 110 transmits all the data to be transmitted to the subsystem interface 210, the synchronization signal SS having a signal width greater than the signal width of the synchronization signal SS indicating that a new payload signal is to be provided may be provided to the subsystem interface 210 through the port SO.

Meanwhile, the subsystem interface 110 may provide the synchronization signal SS to the subsystem interface 210 by monitoring the flow control signal FCS received through the port FCI.

When the data storage amount of the reception buffers 186 and 188 of FIG. 2 exceeds a predetermined storage amount due to the data received from the subsystem interface 110, the subsystem interface 210 may inform the subsystem interface 110 of this fact through the flow control signal FCS outputted to the port FCO.

Accordingly, the subsystem interface 110 may monitor the flow control signal FCS received through the port FCI, and provide the synchronization signal SS to the subsystem interface 210 through the port SO only in a state where the data storage amount of the reception buffers 186 and 188 of the subsystem interface 210 does not exceed the predetermined storage amount.

Figure 8:
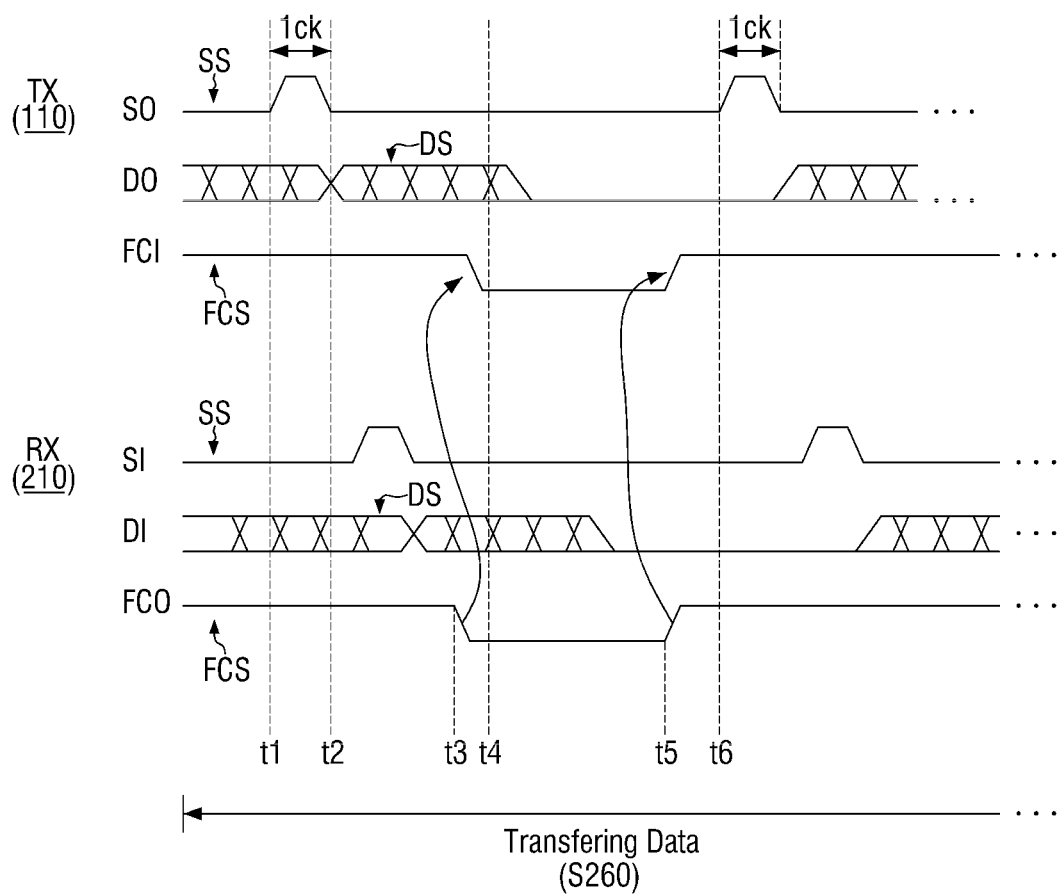
FIG. 8 is a timing diagram further illustrating the communications method of FIG. 3.

Referring to FIGS. 2 and 8, at a first time point t1 at which the last packet signal of the payload signal is outputted through the port DO, the subsystem interface 110 monitors the flow control signal FCS received at the port FCI. Since the signal level of the flow control signal FCS is maintained at the second level H, it may be determined that the storage amount of the reception buffers of the subsystem interface 210 does not exceed the predetermined storage amount.

Accordingly, the synchronization signal SS is generated and the generated synchronization signal SS is outputted through the port SO. In an exemplary embodiment, the signal width of the synchronization signal SS may be equal to, for example, one cycle of the clock signal CKS, but the embodiments are not limited thereto.

The synchronization signal SS outputted through the port SO of the subsystem interface 110 may be received by the subsystem interface 210 through the port SI.

At a second time point t2, a new payload signal may be outputted through the port DO of the subsystem interface 110. Then, the output payload signal may be received by the subsystem interface 210 through the port DI.

While the data transmission is performed in this manner, at a third time point t3, the reception buffers of the subsystem interface 210 may exceed the predetermined storage amount. In this case, the subsystem interface 210 changes the signal level of the flow control signal FCS outputted to the port FCO from the second level H to the first level L. The subsystem interface 110 having received the flow control signal FCS through the port FCI may recognize that a storage space is insufficient in the reception buffers of the subsystem interface 210.

At a fourth time point t4 at which it is necessary to inform that a new payload signal is to be provided, the subsystem interface 110 monitors the flow control signal FCS received at the port FCI. Since the signal level of the flow control signal FCS is still maintained at the first level L, the subsystem interface 110 does not generate the synchronization signal SS unlike the first time point t1. Thus, the transmission of the data signal DS through the port DO is also stopped.

Then, at a fifth time point t5, when the data storage amount of the reception buffers of the subsystem interface 210 is less than or equal to the predetermined storage amount, the subsystem interface 210 changes the signal level of the flow control signal FCS outputted to the port FCO from the first level L to the second level H. The subsystem interface 110 having received the flow control signal FCS through the port FCI may recognize that the shortage of the storage space of the reception buffers of the subsystem interface 210 has been alleviated.

Then, at a sixth time point t6, the subsystem interface 110 outputs, for example, the synchronization signal SS, which may be the same as one cycle of the clock signal CKS, through the port SO. The synchronization signal SS outputted through the port SO of the subsystem interface 110 may be received by the subsystem interface 210 through the port SI. Then, a new payload signal is outputted through the port DO of the subsystem interface 110, and the output payload signal may be received by the subsystem interface 210 through the port DI.

Through this process, the transmission of a message or data required to be transmitted from the subsystem interface 110 to the subsystem interface 210 may be performed.

Then, referring to FIG. 3, the connection is terminated at step S300.

Figure 9:
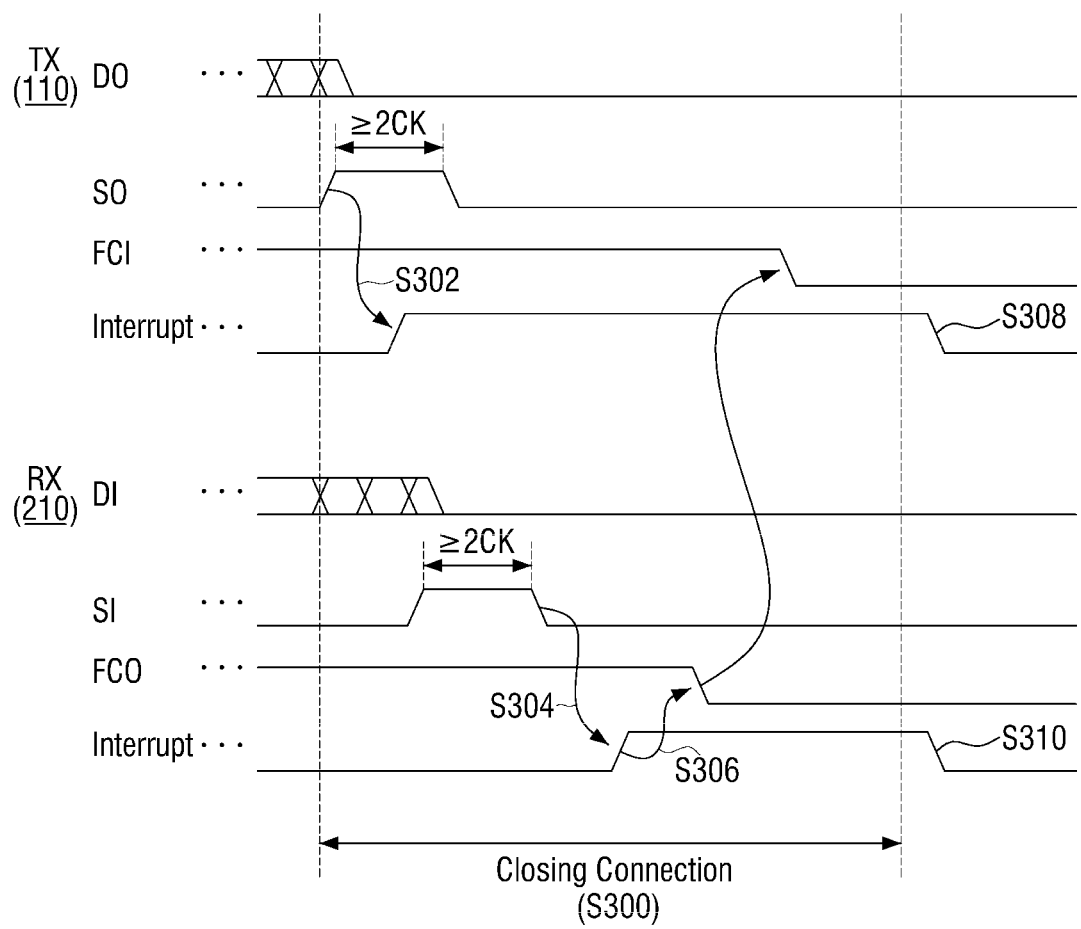
FIG. 9 is a timing diagram further illustrating the communications method of FIG. 3.

Referring to FIGS. 2, 4 and 9, when the subsystem interface 110 completes transmission of all data required to be transmitted to the subsystem interface 210, the subsystem interface 110 outputs, for example, the synchronization signal SS having a signal width different from the SS for a new payload, such as one of at least two cycles of the clock signal CKS, through the port SO. Subsequently, an in-band interrupt is generated in the subsystem 100 of FIG. 1 including the subsystem interface 110 at step S302 of FIG. 9.

When an in-band interrupt occurs in the subsystem 100 of FIG. 1, the configuration module 140 of the subsystem interface 110 of FIG. 2 may perform configuration on the transmission parameters according to the termination of the connection of the subsystem interface 110.

Meanwhile, the subsystem interface 210 having received, for example, the synchronization signal SS indicating completed transmission, such as having a signal width of at least two cycles of the clock signal CKS, through the port SI, may generate an in-band interrupt to the subsystem 200 of FIG. 1, in which the subsystem interface 210 is included, at step S304 of FIG. 9.

When an in-band interrupt occurs in the subsystem 200, the configuration module 240 of the subsystem interface 210 may perform configuration on the transmission parameters according to the termination of the connection of the subsystem interface 210.

Since the flow control signal FCS is no longer needed, the subsystem interface 210 changes the signal level of the flow control signal FCS from the second level H to the first level L at step S306. The subsystem interface 110 receives the flow control signal FCS through the port FCI.

Then, the ports FCO and FCI may be used to transmit and receive the connection response signal ACK or AC in the next connection. In addition, the ports DO and DI may be used to transmit and receive the connection request signal RS in the next connection.

The in-band interrupt generated in the subsystem 100 may be cleared by software at step S308, and the in-band interrupt generated in the subsystem 200 may be cleared by software at step S310.

Through this process, the connection for message or data transmission between the subsystem interface 110 and the subsystem interface 210 may be terminated.

As described above, in the present embodiment, four wires are required for the first subsystem to transmit a message or data to the second subsystem, and four wires are required for the second subsystem to transmit a message or data to the first subsystem. In other words, a total of eight wires may be used to exchange messages or data between two different subsystems.

Furthermore, as described above, since the subsystem 100 and the subsystem 200 of FIG. 1 establish a connection for communication using an in-band interrupt, there is no need for a separate medium such as a mailbox for communication between subsystems. That is, it is not necessary to place the medium for communication in the power supply voltage region to which the power supply voltage is continuously provided. Thus, power consumption can be reduced and signal congestion can be alleviated.

Further, according to the present embodiment, it is possible to transmit a large amount of data between the subsystems. Furthermore, when transmitting a large amount of data, it is not necessary to provide a separate first-in first-out (FIFO) que, and a conventional storage medium in the subsystem can be used for data transmission. In addition, a direct memory access (DMA) function can be used for data transmission without loading a central processing unit (CPU), thereby improving a communication speed.

FIG. 10 illustrates a semiconductor device according to an exemplary embodiment.

Hereinafter, differences from the above-described embodiment will be mainly described, such that duplicate description may be omitted.

Referring to FIG. 10, a semiconductor device 2 may include a plurality of subsystems 600, 700, 800 and 900.

The subsystem 600 may include a subsystem interface 610. The subsystem interface 610 may include a transmitter 620 and a receiver 630. The transmitter 620 may include a first transmitter 622, a second transmitter 624 and a third transmitter 626, and the receiver 630 may include a first receiver 632, a second receiver 634 and a third receiver 636.

The subsystem 700 may include a subsystem interface 710. The subsystem interface 710 may include a transmitter 720 and a receiver 730. The subsystem 800 may include a subsystem interface 810. The subsystem interface 810 may include a transmitter 820 and a receiver 830. The subsystem 900 may include a subsystem interface 910. The subsystem interface 910 may include a transmitter 920 and a receiver 930.

In this embodiment, the subsystem 600 may broadcast a message or data to the subsystems 700, 800 and 900, or may transmit to each separately.

To this end, the first transmitter 622 of the subsystem 600 may be connected to the receiver 730 of the subsystem 700, the second transmitter 624 of the subsystem 600 may be connected to the receiver 830 of the subsystem 800, and the third transmitter 626 of the subsystem 600 may be connected to the receiver 930 of the subsystem 900. Similarly, the first receiver 632 of the subsystem 600 may be connected to the transmitter 720 of the subsystem 700, the second receiver 634 of the subsystem 600 may be connected to the transmitter 820 of the subsystem 800, and the third receiver 636 of the subsystem 600 may be connected to the transmitter 920 of the subsystem 900.

According to this configuration, the subsystem 600 may simultaneously transmit the same message or data to the subsystems 700, 800 and 900, or may transmit to each separately. Specifically, the subsystem 600 may simultaneously transmit the same message or data to the subsystems 700, 800 and 900 after the creation of the connection with all the subsystems 700, 800 and 900 is completed.

In an exemplary embodiment, the subsystem 600 may include a sensor subsystem or a voice trigger subsystem, and the subsystems 700, 800 and 900 may include a cellular subsystem, a navigation subsystem and an audio subsystem, respectively. The subsystem 600 may periodically broadcast sensor data, voice input data, or audio input data to the subsystems 700, 800 and 900. However, the embodiments are not limited thereto, and the embodiments of the subsystems 600, 700, 800 and 900 may be modified in different ways.

In concluding this detailed description, those of ordinary skill in the pertinent art will appreciate that many variations and modifications may be made to the exemplary embodiments described herein without departing from the principles, scope and spirit of the present disclosure. Therefore, the disclosed embodiments of the invention have been provided in a generic and descriptive sense, only, and not for purposes of limitation. The present invention is defined as set forth in the following claims and their equivalents.

What is claimed is:

1. A subsystem interface comprising:
a transmitter including a first transmission port configured to transmit a first clock signal, a second transmission port configured to transmit a first data signal, a first reception port configured to receive a first flow control signal, and a third transmission port configured to transmit a first synchronization signal;
a receiver including a second reception port configured to receive a second clock signal, a third reception port configured to receive a second data signal, a fourth transmission port configured to transmit a second flow control signal, and a fourth reception port configured to receive a second synchronization signal; and
a control module configured to control operations of the transmitter and the receiver, including performing a transmitter hand-shake by sending a request signal from the second transmission port and receiving an acknowledgement signal to the first reception port, or performing a receiver hand-shake by receiving the request signal to the third reception port and sending the acknowledgement signal from the fourth transmission port.

2. The subsystem interface of claim 1, wherein the control module transmits a connection request signal through the second transmission port, and after receiving a connection response signal as a response to the connection request signal through the first reception port, transmits the first data signal through the second transmission port.

3. The subsystem interface of claim 2, wherein the control module stops transmitting the first data signal when a signal level of the first flow control signal received through the first reception port is changed while transmitting the first data signal through the second transmission port.

4. The subsystem interface of claim 2, wherein the first data signal includes first and second payload signals, and
wherein the control module transmits the first synchronization signal through the third transmission port in response to the first payload signal, and transmits the first synchronization signal through the third transmission port in response to the second payload signal.

5. The subsystem interface of claim 4, wherein the control module transmits the first synchronization signal through the third transmission port before the first payload signal is transmitted through the second transmission port, and
wherein the control module transmits the first synchronization signal through the third transmission port before the second payload signal is transmitted through the second transmission port.

6. The subsystem interface of claim 4, wherein the first synchronization signal includes a third synchronization signal having a first signal width and a fourth synchronization signal having a second signal width different from the first signal width,
wherein the control module transmits the third synchronization signal through the third transmission port in response to the first and second payload signals, and
wherein the control module transmits the fourth synchronization signal through the third transmission port in response to completion of transmission of the first data signal.

7. The subsystem interface of claim 6, wherein the second signal width is greater than the first signal width.

8. The subsystem interface of claim 2, wherein the control module receives a connection request signal through the third reception port, and
wherein the control module transmits a connection response signal through the fourth transmission port in response to the connection request signal.

9. The subsystem interface of claim 1, wherein the control module receives a connection request signal through the third reception port,
wherein the control module generates an interrupt in response to the connection request signal, and
wherein the control module transmits a connection response signal through the fourth transmission port in response to the connection request signal.

10. The subsystem interface of claim 9, wherein the control module changes a signal level of the second flow control signal transmitted through the fourth transmission port if an amount of data stored in a reception buffer is equal to or greater than a predetermined storage amount while receiving the second data signal through the third reception port.

11. The subsystem interface of claim 1, wherein the second synchronization signal includes a third synchronization signal having a first signal width and a fourth synchronization signal having a second signal width different from the first signal width, and
wherein the control module receives the third and fourth synchronization signals through the fourth reception port,
wherein the control module does not generate an in-band interrupt in response to the third synchronization signal, and
wherein the control module generates an in-band interrupt in response to the fourth synchronization signal.

12. A semiconductor device comprising:
a first subsystem including a first subsystem interface having first to fourth ports, the first subsystem interface being configured to establish a first side of a connection using the first to third ports and transmit data using the first to fourth ports, and a first control module configured to perform a transmitter hand-shake by sending a request signal from the second port and receiving an acknowledgement signal to the third port; and
at least one second subsystem including a second subsystem interface having fifth to eighth ports, the second subsystem interface being configured to establish a second side of the connection with the first subsystem interface by communicating with the first to third ports of the first subsystem interface using the fifth to seventh ports, and to receive data from the first subsystem interface by communicating with the first to fourth ports of the first subsystem interface using the fifth to eighth ports, and a second control module configured to perform a receiver hand-shake by receiving the request signal to the sixth port and sending the acknowledgement signal from the seventh port,
wherein the first subsystem interface transmits a clock signal to the fifth port through the first port,
wherein the first subsystem interface transmits a connection request signal to the sixth port through the second port, and
wherein the second subsystem interface transmits a connection response signal to the third port through the seventh port.

13. The semiconductor device of claim 12, further comprising:
a power supply voltage region to which a power supply voltage is continuously provided;
an operation region to which the power supply voltage is not continuously provided; and
wake-up logic disposed in the power supply voltage region,
wherein the second subsystem is disposed in the operation region, and
wherein the wake-up logic receives a signal from the first subsystem to supply power to the second subsystem.

14. The semiconductor device of claim 13, wherein the first subsystem interface transmits a connection request signal to the wake-up logic and the sixth port through the second port, and
wherein the wake-up logic supplies power to the second subsystem in response to the connection request signal.

15. The semiconductor device of claim 12, wherein the first subsystem interface transmits the data to the sixth port through the second port after the second side of the connection is established.

16. The semiconductor device of claim 12, wherein the second subsystem interface generates an in-band interrupt to establish the second side of the connection with the first subsystem interface in response to the connection request signal received through the sixth port, and wherein the connection response signal is generated by the in-band interrupt, and the second subsystem interface transmits the connection response signal to the third port through the seventh port.

17. The semiconductor device of claim 12, wherein the first subsystem interface changes a signal level of the connection request signal in response to the connection response signal received through the third port.

18. A communications method comprising:
    providing a first subsystem interface including at least first to fourth ports and a second subsystem interface including at least fifth to eighth ports;
    performing at least one of a transmitter hand-shake by sending a first signal from the second port and receiving a second signal to the third port, or a receiver hand-shake by receiving the first signal to the sixth port and sending the second signal from the seventh port; and
    transmitting data from the first subsystem to the second subsystem by providing a third signal from the first port to the fifth port, providing a fourth signal from the second port to the sixth port, providing a fifth signal from the seventh port to the third port, and providing an eighth signal from the fourth port to the eighth port,
    wherein the signal provided from the first port to the fifth port is a clock signal.

19. The communications method of claim 18, wherein the signal provided from the second port to the sixth port is a connection request signal, and the signal provided from the seventh port to the third port is a connection response signal, the method further comprising:
    in response to the connection request signal, generating a first in-band interrupt to a second subsystem including the second subsystem interface; and
    providing, by the first in-band interrupt, the connection response signal to establish a connection between the first subsystem interface and the second subsystem interface.

* * * * *